Figure 4:
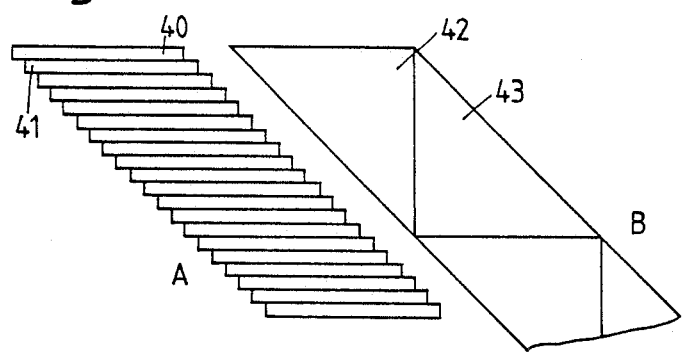

United States Patent [19]

Beasley

[11] Patent Number: 4,825,033
[45] Date of Patent: Apr. 25, 1989

[54] VARIABLE SHAPED SPOT ELECTRON BEAM PATTERN GENERATOR

[75] Inventor: James P. Beasley, Lower Kingswood, England

[73] Assignee: U.S. Philips Corporation, New York, N.Y.

[21] Appl. No.: 119,591

[22] Filed: Nov. 12, 1987

[30] Foreign Application Priority Data

Nov. 24, 1986 [GB] United Kingdom ............ 8628058

[51] Int. Cl.$^4$ .......................................... B23K 15/00
[52] U.S. Cl. ...................... 219/121.25; 219/121.27; 250/396 ML
[58] Field of Search ............ 219/121 ER, 121 ES, 219/121 ET, 121.25, 121.26, 121.27; 250/491.1, 492.23, 492.24, 356 ML

[56] References Cited

U.S. PATENT DOCUMENTS 4,413,187 11/1983 Akazawa et al. ............ 219/121 ER

FOREIGN PATENT DOCUMENTS 0139983 2/1980 Fed. Rep. of Germany ... 250/492.2

Primary Examiner—C. L. Albritton
Attorney, Agent, or Firm—Paul R. Miller

[57] ABSTRACT

The electron beam 2 of the generator illuminates a first rectangular aperture 4 which is then imaged on a second rectangular aperture 10 by a magnetic lens 7 having reversible flux. The flux of the lens is chosen so that the focused image of the first aperture is rotated by 22.5+45n degrees where n=0,1,2 etc. One flux direction places the aperture image sides 8 parallel to the second aperture sides so that a rectangular shaped beam emerges. The other flux direction places the aperture image sides 8' at 45 degrees to the second aperture sides so that a triangular shaped beam emerges. A beam deflector 6 between the apertures allows rectangles or 45 degree isoceles triangles of a range of sizes to be produced. Thus triangles are produced without further generator components being needed.

5 Claims, 3 Drawing Sheets

Fig.1.
Fig.2.
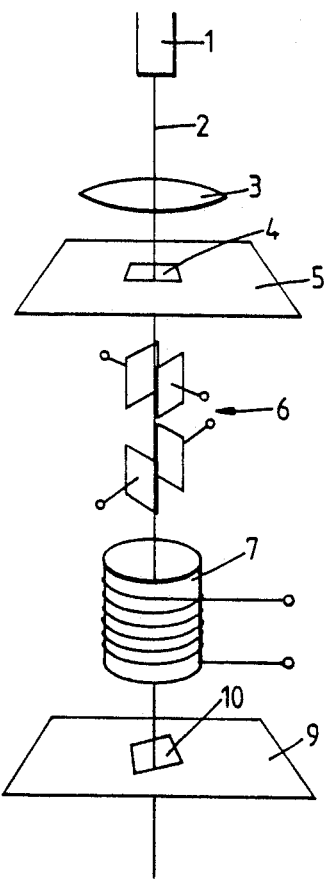
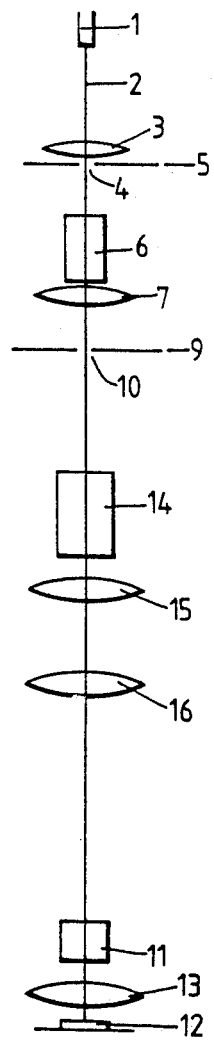
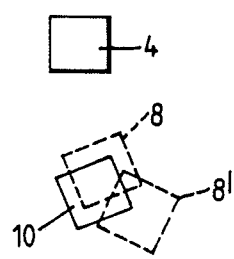

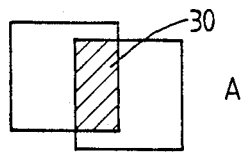
A
Fig. 3.
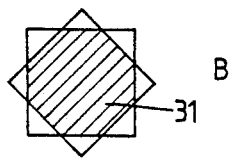
B
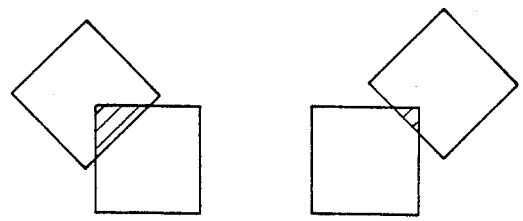
C
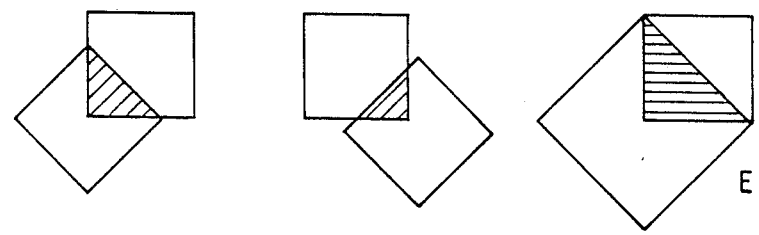
E
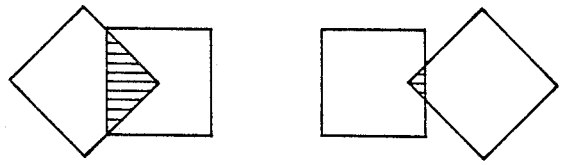
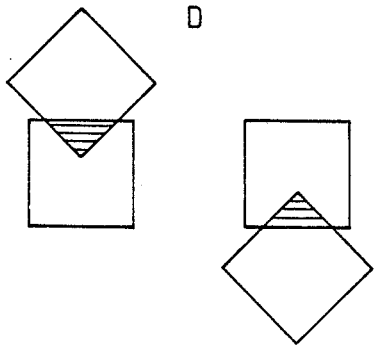
D

VARIABLE SHAPED SPOT ELECTRON BEAM PATTERN GENERATOR

This invention relates to electron beam pattern generators in which the shape of the electron beam spot can be varied. More specifically, it relates to an electron beam pattern generator comprising an electron gun for emitting an electron beam, a first rectangular aperture for shaping the cross-section of the electron beam into a rectangular shape, an electron-optic lens focusing an image of the first rectangular aperture on the plane of a second rectangular aperture, a beam shaper deflection system for deflecting the image over the plane of the second rectangular aperture, means for projecting the electron beam emerging from the second aperture onto a target plane to form a shaped beam spot by overlap of the image of the first aperture on the second aperture, and means for scanning the shaped beam spot on the target plane to generate a pattern. Such a pattern generator is used to write the patterns of integrated circuits in an electron sensitive resist on a substrate. An electron beam pattern generator is described in European Pat. No. 0.049,872B. This beam shaper deflection system allows rectangular electron beam spots of constant current density and of a variety of sizes and aspect ratios to be generated. However, fine lines can only be written quickly if they are parallel to the sides of the rectangular spot. IF a sloping line or edge is required it has to be produced more slowly by a succession of parallel slit exposures written adjacently with the start and finish positions of each slit defining the sloping edge.

It is clear from current very large scale integrated circuits (VLS1) that 45 degree sloping edges and lines are becoming routine in several of the wafer process steps, notably in the interconnection layers which can be densely populated.

In an article entitled "A high speed EBL column designed to minimise beam interactons" by Lee H. Veneklasen in Journal of Vacuum Science and Technology B 3(1) Jan./Feb. 1985, p185 an electron beam pattern generator is described in which two second rectangular apertures are provided side by side, the sides of one aperture being at 45 degrees to the sides of the other aperture. The image of a first rectangular aperture is arranged to overlap one or other of the second apertures thereby generating rectangles or 45 degree right angled triangles respectively. Two first apertures are provided side by side and arrangements are provided to switch the electron beam from one first aperture and an associated second aperture to the other first aperture and its associated second aperture.

It is an object of the invention to provide an electron beam pattern generator using only one first aperture and one second aperture with simple electron optical arrangements for controlling the size and shape of the electron beam spot.

The invention provides an electron beam pattern generator as described in the opening paragraph characterized in that the electron-optic lens is a magnetic lens having reversible magnetic flux, in that the magnetic flux of the lens produces a rotation of the focused image of $22.5+n.45$ degrees where $n=0, 1, 2$, etc., in that one flux direction places the sides of the focused image of the first rectangular aperture parallel to sides of the second rectangular aperture, the beam shaper deflection system being energisable so that the overlap of the images defines a rectangle, and in that the other flux direction places the sides of the focused image of the first rectangular aperture at 45 degrees to the sides of the second rectangular aperture, the beam shaper deflection system being energisable so that the overlap of the images defines a 45 degree right angles triangle. Thus advantage is taken on the image rotation property of the magnetic lens, which is necessarily present to image one aperture upon the other, to obtain either rectangular or triangular spots. No arrangements are needed to switch the electron beam.

The time taken to change from rectangular spots to triangular spots is important in relation to the overall writing speed of the generator since large numbers of such changes will be needed in some patterns. Advantageously, the invention provides an electron beam pattern generator further characterised in that the electron-optic lens comprises a coil wound axially around the beam the coil being substantially free of ferromagnetic material. The inductance of the electron optic lens is thereby minimised, permitting rapid reversal of magnetic flux in the lens with a given applied voltage and hence rapid change of sopt shape.

To obtain an equal range of spot sizes in two directions at right angles, the invention may be yet further characterized in that the first and second rectangular apertures are square. When the invention is used to generate a 45 degree right angled triangle, the two sides of the triangle enclosing the right angle may be parallel to the sides of the first aperture, giving four possible orientations of the triangle. Alternatively, the hypotenense of the triangle may be parallel to the sides of the first aperture, giving a further four possible orientations of the triangle. It should be noted that the beam shaper deflection system can also be used to deflect the image of the first aperture relative to the second aperture so that a range of figures can be produced having angles which are combinations fo 90-degrees, 45 degrees and 135 degrees, up to an octogon having all eight angles 135 degrees.

The second aperture need not be the same size as the image of the first aperture. Then, the smaller one can define a rectangle corresponding to its own shape when the large image is centered over the smaller. Thus a rectangle of fixed size can be obtained while in the triangle mode simply by centering the apertures.

Thus, while the primary purpose of the invention is to produce rectangular or triangular spots, other shapes can be produced.

It was noted above that the time taken to reverse the flux in the electron-optic lens is an important element in determining the speed of writing of the electron beam pattern generator. If the number of reversals of flux made while writing the area covered by the scanning means can be minimised, the writing speed will be correspondingly increased. In accordance with the invention a method of using an electron beam pattern generator is provided characterised in that a rectangular field, covered by the range of the scanning means and to be exposed by the shaped beam spot, is divided into columns, in that a column is exposed from the top of the column to the bottom with one flux direction in the electron optic lens, followed by a flux reversal and exposure from the bottom to the top of the column, and in that an adjacent column is then exposed from top to bottom with reversed flux maintained, followed by a flux reversal and exposure from bottom to top of the adjacent column, whereby only one flux reversal is required for each column exposed with both flux directions. Thus a minimum number of flux reversals is needed when writing a given area.

Figure 5:
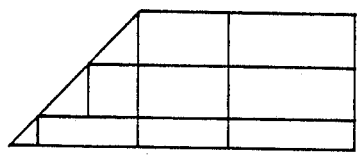
Figure 6:
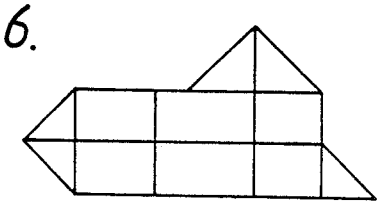
Figure 7:
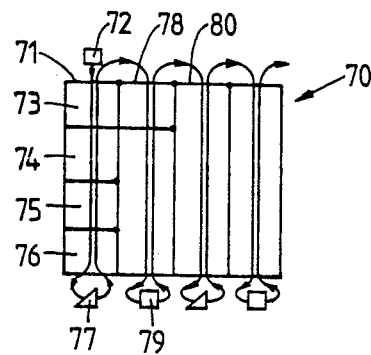

An embodiment of the invention will now be described with reference to the accompanying drawings in which, FIG. 1 shows a part perspective schematic layout of a spot shaping system of an electron beam pattern generator, FIG. 2 shows the schematic layout of the complete electron beam pattern generator, FIG. 3 shows a range of spot shapes obtainable with the invention, FIG. 4 illustrates the increase in writing speed obtained when writing a 45 degree sloping line, FIGS. 5 and 6 show two typical pattern units that can be generated using the invention, and FIG. 7 illustrates schematically a method of exposing a substrate to a shaped beam spot.

Referring to FIGS. 1 and 2 an electron gun 1 is shown schematically providing an electron beam, only the central ray 2 being shown. A first shaper lens 3 images the gun crossover at a beam shaper deflection system 6 and directs the beam through a first rectangular aperture 4 in a first mask 5. Lens 3 is shown schematically as an optical lens to represent the usual magnetic lens. The same convention is used in FIG. 2. The beam shaper deflection system 6 is shown schematically as two pairs of electrostatic deflection plates at right angles to one another to which d.c. voltages can be applied to produce deflection of the electron beam in two orthogonal directions. Alternatively two paris of orthogonal saddle coils can be used at the same location to provide magnetic deflection. An electron optic lens 7 focuses an image 8,8' of the aperture 4 on the plane of a second mask 9 having a second rectangular aperture 10. The beam shaper deflection system 6 can be used to deflect the image 8,8' in any controlled direction and amount on the mask 9 to form a shaped beam spot by overlap of the image of the first aperture on the second aperture. FIG. 2 shows a second beam deflection system 11 for scanning the shaped beam spot on a target plane 12 to generate a pattern. A final objective lens 13 demagnifies and focuses the spot on the target at the required size.

The electron optic lens 7 is shown as a coil wound axially around the beam. Desirably the coil is free of ferromagnetic material and is as small as possible so that its inductance is minimised. Since the lens 7 is electromagnetic, it rotates its image with respect to its object source by an angle proportional to the integral of the axial magnetic field component B of the lens along the axis. However, the focusing action of lens 7 is proportional to the integral of the square of the axial magnetic field component along the axis. Thus the distribution B along the axis and the distance between the aperture planes can be chosen so that sharp focus is obtained with a predetermined rotation of the image. Reversal of the d.c. energising current in the coil of lens 7 reverses the direction of rotation of the image while maintaining focus. Thus a total image rotation equal to twice the lens rotation can be produced by reversing the lens d.c. energising current.

The beam shaper can thus be operated in either of two modes, depending on the direction of the energising current. Corresponding sides of the rectangular apertures are preset at an angle of 22.5 degrees to one another and the lens rotation is, for example, chosen to be 22.5 degrees. In the first mode, the sides of the image of the first aperture are parallel to the sides of the second aperture. Depending on the deflection given to the image by the deflection system 6, the overlap of the image on the second apertures defines a rectangle with adjustable aspect ratio. In the second mode, the energising current of lens 7 is reversed and the sides of the image of the first aperture are at 4.5 degrees to the sides of the second aperture. The situation in the two modes is depicted schematically in the lower half of FIG. 1, 8 being the image in the first mode and 8' being the image in the second mode.

FIG. 3 shows typical overlap situations in the two modes and hence some shapes of spot which are possible. In A, the first mode is in operation and the overlap defines a rectangle 30. In B, C, D and E the second mode is in operation. B shows the overlap with no deflection of the image, an octogonal spot 31 being formed. In C the image is deflected to produce the desired 45 degree right angled triangle in four possible orientations. In D a further four 45 degree right angled triangles are produced but in orientations 45 degrees apart from those in C. In both C and D the size of the triangle produced depends on the deflection given to the image which can be selected at will.

So far, it has been assumed that the first aperture image and the second aperture are squares of the same size. There is, in fact, no restriction on the relative sizes of image and second aperture. In E, for example, the image is a square having twice the area of the second aperture. The maximum size of 45 degree right angled triangle that can be produced is thereby increased.

It should be noted that the rotation of the lens is not restricted to 22.5 degrees. It can in fact be 22.5+n 45 degrees where n=0, 1, 2 ... etc. Thus for n=1, the lens rotation is 67.5 degrees, the total reversal rotation being 135 degrees. Since the apertures are rectangles an additional rotation by 90 degrees, or any multiple of 90 degrees, over 45 degrees, still leaves the image sides parallel to the second aperture sides in one mode and at 45 degrees in the other mode. The choice of n can be made to facilitate the design of lens 7.

Returning to FIG. 2 a schematic layout is shown of a practical electron beam pattern generator. In addition to the components already described a beam blanker 14 is provided which enables the beam to be switched off during spot movement and switched on for predetermined periods, or "flashes", to achieve a desired electron exposure. Condenser lenses 15 and 16 are provided to produce the desired reduction in size of the spot before the final reduction provided by objective lens 13 to give places at which further devices, such as astigmatism correctors, can be located.

FIG. 4 shows the improvement in writing speed and pattern definition obtained when using the invention to write a line sloping at 45 degrees. In A it is assumed that the electron beam pattern generator has the capacity to write only rectangles in one orientation. The sloping line is generated by shaping the spot to a long horizontal rectangle having a vertical height consistent with the edge definition that is acceptable. A first exposure 40 is made after which the beam is turned off, displaced vertically and horizontally by the rectangle height and the next exposure 41 then made. The sloping line is generated by repeating this procedure as often as needed to produce the length of line required. In B, using the invention, the second mode is used to create a 45 degree triangle having a base length equal to the horizontal width of the sloping line. One exposure, equal in time to the exposure 40, produces a 45 degree triangle 42. The beam is then turned off and the shaper deflection system is energised to produce a triangle 43 equal in size to triangle 42 but of opposite orientation. The second beam deflection system 11 is then used to position triangle 43 adjacent triangle 42 to define a first segment of the sloping line and a second exposure is made. In the example of FIG. 4 the two triangular exposures in B expose in area equal to that covered by 14 rectangular exposures in A, thus reducing the exposure time by a factor of 7 and at the same time providing a smooth edged line rather than a stepped edge line.

FIGS. 5 and 6 show two typical patterns that can be generated using the invention. It will be seen that rectangles of various aspect ratios and sizes and 45 degree right angled triangles of different orientations and sizes can be assembled to produce a wide range of shapes of exposed areas on a substrate. The 45 degree sloping edges of such shapes are as smooth and sharply defined as are the horizontal and vertical edges.

FIG. 7 shows a method of exposing an area on a substrate which minimises the number of flux reversals in the electron-optic lens. A square area 70 on a substrate, typically 2 mm square, is covered by the scanning means. The area 70 is divided into columns of square sub-areas, typically 50 microns square. The writing is arranged so that, at the top 71 of the first column, the flux direction producing rectangles 72 is selected. All the rectangles in sub area 73 are then written, followed by all the rectangles in sub-areas 74, 75 and 76 in sequence. At the bottom of the first column a flux reversal is made to produce triangles 77. All the triangles in sub-area 76 are then written followed by all the triangles in sub-area 75, 74 and 73 in that sequence. At the top 71 of the first column, the shaped beam spot is moved across to the top of the adjacent column 78 without a flux reversal. Then the triangles in all the sub-areas of column 78 are written from top to bottom of the column. At the bottom of column 78 a flux reversal is made to produce rectangles 79. Then all the rectangles in column 78 are written from bottom to top. At the top of column 78 the spot is moved to the top 80 of the next adjacent column in preparation for writing rectangles in that column, the flux direction now being the same as it was at the top 71 of the first column. This writing sequence is repeated for all the columns, there being only one flux reversal per column, at the bottom of each column in this example of the method. Thus the number of flux reversals is minimized, correspondingly increasing the writing speed.

Alternatively, it may be desirable to complete the writing of rectangles and triangles in each sub-area before passing onto the next. IF a particularly finely detailed pattern is being written, the registration of rectangles with triangles may be crucial. If the rectangles and triangles are written on one sub-area immediately after one another, drift effects in the beam and deflection circuitry are minimised. In this case the rectangles in one sub-area are written followed by a flux reversal of the lens after which the triangles in that sub-area are written. Then the beam passes to the next adjacent sub-area and triangles are written first followed by a flux reversal and rectangle writing. Thus only one flux reversal per sub-area is needed.

I claim:

1. An electron beam pattern generator comprising an electron gun for emitting an electron beam, a first rectangular aperture for shaping the cross-section of the electron beam into a rectangular shape, an electron-optic lens focusing an image of the first rectangular aperture on the plane of a second rectangular aperture, a beam shaper deflection system for deflecting the image over the plane of the second rectangular aperture, means for projecting the electron beam emerging from the second aperture onto a target plane to form a shaped beam spot by overlap of the image of the first aperture on the second aperture, and means for scanning the shaped beam spot on the target plane to generate a pattern, characterised in that the electron-optic lens is a magnetic lens having reversible magnetic flux, in that the magnetic flux of the lens produces a rotation of the focused image of $22.5 + 45$ n degrees where $n = 0, 1, 2$, etc., in that one flux direction places the sides of the focused image of the first rectangular aperture parallel to the sides of the second rectangular aperture, the beam shaper deflection system being energisable so that the overlap of the images defines a rectangle, and in that the other flux direction places the sides of the focused image of the first rectangular aperture at 45 degrees to the sides of the second rectangular aperture, the beam shaper deflection system being energisable so that the overlap of the images defines a 45 degree right angled triangle.

2. An electron beam pattern generator as claimed in claim 1, characterised in that the electron-optic lens comprises a coil wound axially around the beam, the coil being substantially free of ferromagnetic material.

3. An electron beam pattern generator as claimed in claim 1 of claim 2, characterised in that the first and second rectangular apertures are square.

4. A method of using an electron beam pattern generator as claimed in claim 1 or claim 2, characterised in that a rectangular field, covered by the range of the scanning means and to be exposed by the shaped beam spot, is divided into columns, in that a column is exposed from the top of the column to the bottom with one flux direction in the electron optic lens, followed by a flux reversal and exposure from the bottom to the top of the column, and in that an adjacent column is then exposed from top to bottom with reversed flux maintained, followed by a flux reversal and exposure from bottom to top of the adjacent column whereby only one flux reversal is required for each column exposed with both flux directions.

5. A method of using an electron beam pattern generator as claimed in claim 1 or claim 2, characterised in that a field, covered by the range of the scanning means and to be expoded by the shaped beam spot, is divided into sub-areas, in that a sub-area is exposed with rectangles with one flux direction in the electron optic lens, followed by a flux reversal and exposure of that sub-area with triangles, and in that an adjacent sub-area is then exposed with triangles with reversed flux maintained, followed by a flux reversal and exposure with rectangles whereby only one flux reversal is required for each sub-area exposed with both flux directions.

* * * * *